US005549935A

United States Patent [19]

Nguyen et al.

[11] Patent Number: 5,549,935

[45] Date of Patent: *Aug. 27, 1996

[54] ADHESION PROMOTION OF FLUOROCARBON FILMS

[75] Inventors: Thao N. Nguyen, Katonah; Gottlieb S. Oehrlein, Yorktown Heights; Zeev A. Weinberg, White Plains, all of N.Y.

[73] Assignee: International Business Machines Corporation, Armonk, N.Y.

[ * ] Notice: The term of this patent shall not extend beyond the expiration date of Pat. No. 5,244,730.

[21] Appl. No.: 368,764

[22] Filed: Jan. 4, 1995

Related U.S. Application Data

[62] Division of Ser. No. 693,735, Apr. 30, 1991, abandoned.

[51] Int. Cl.[6] .............................. C08J 7/18; C23C 14/14; H05H 1/00

[52] U.S. Cl. .......................... 427/490; 427/527; 427/535; 427/578

[58] Field of Search .................................... 428/641, 620, 428/626, 699, 698, 704, 472, 463, 457, 420, 421, 422, 235, 178, 33.4; 427/490, 527, 563, 574, 578, 579, 535

[56] References Cited

U.S. PATENT DOCUMENTS

| | | | |
|---|---|---|---|
| 3,389,012 | 6/1968 | Hamm | 427/490 |
| 3,656,995 | 4/1972 | Reedy, Jr. | 117/69 |
| 3,774,703 | 11/1973 | Sanderson | 428/626 |
| 4,391,843 | 7/1983 | Kaganowicz | 427/41 |
| 4,524,089 | 6/1985 | Haque | 427/38 |
| 4,528,066 | 7/1985 | Merkling, Jr. et al. | 204/198.37 |
| 4,557,943 | 12/1985 | Rosler | 427/38 |
| 4,571,348 | 2/1986 | Troxell | 427/527 |
| 4,647,494 | 3/1987 | Meyerson et al. | 428/216 |
| 4,735,996 | 4/1988 | Nagai et al. | 428/422 |
| 4,762,803 | 8/1988 | Sato et al. | 427/535 |
| 4,791,012 | 12/1988 | d'Agostino et al. | 427/490 |
| 4,938,995 | 7/1990 | Giordano et al. | 427/490 |
| 5,041,304 | 8/1991 | Kusano et al. | 427/535 |
| 5,091,204 | 2/1992 | Ratner et al. | 427/490 |
| 5,156,919 | 10/1992 | Brar et al. | 427/490 |
| 5,244,730 | 9/1993 | Nguyen et al. | 427/490 |
| 5,302,420 | 4/1994 | Nguyen et al. | 427/490 |

OTHER PUBLICATIONS

Chapman, "Glow Discharge Processes," RF Charges, 1980, John Wiley & Sons, Inc., pp. 143–146.

D. W. Rice, et al., "Glow Discharge Polymerization of Tetrafluoroethylene, 1,1, Difluoroethylene, and Chlorotrifluoroethylene," J. Electrochem. Soc., Sep. 1976, pp. 1308–1312.

Anderson, et al., "Electron Donor–Acceptor Properties of Thin Polymer Films on Silicon. II. Tetrafluoroethylene Polymerized by RF Flow Discharge Techniques," Journal of Polymer Science, vol. 14, 879–895 (1976).

Chapman, Brian "Glow Discharge Processes", (John Wiley & Sons), NY1980 pp. 278–283.

Handbook of Chemistry and Physics, 57th Ed., p. E–60.

*Primary Examiner*—Marianne Padgett
*Attorney, Agent, or Firm*—Pollock, Vande Sande & Priddy

[57] ABSTRACT

The adhesion between a polymeric fluorocarbon film and a substrate is improved by providing a thin layer of silicon or a silicide intermediate between the substrate and the polymeric fluorocarbon film, such that a region containing a high density of Si-C bonds is formed.

19 Claims, 1 Drawing Sheet

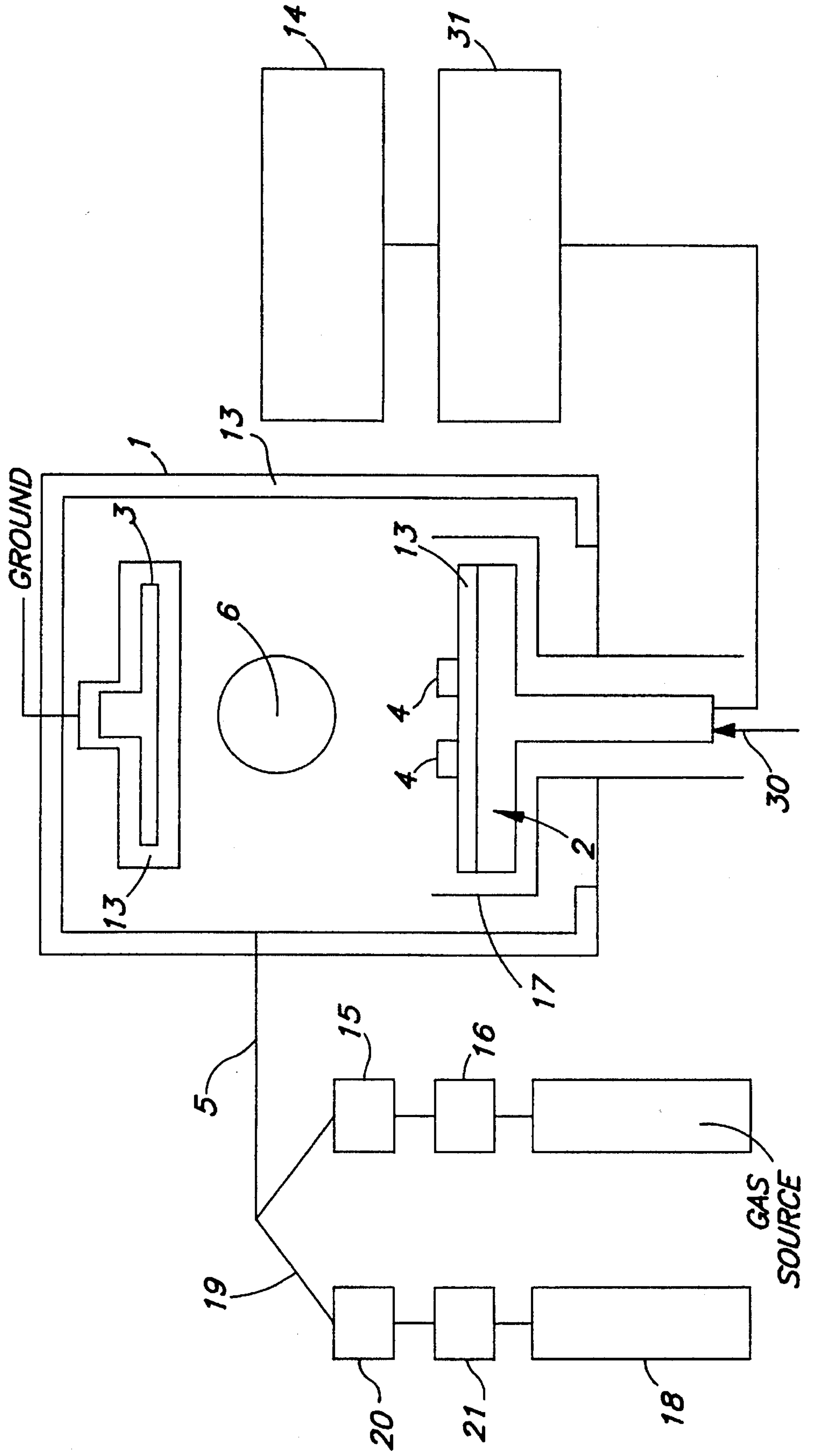
14
31
1
13
GROUND
3
6
13
4
4
2
30
13
17
5
15
16
GAS SOURCE
19
20
21
18

ADHESION PROMOTION OF FLUOROCARBON FILMS

This application is a division of U.S. patent application Ser. No. 07/693,735, filed on Apr. 30, 1991 and now abandon.

TECHNICAL FIELD

The present invention is concerned with improving the adhesion of a polymeric fluorocarbon film to a substrate. The present invention is particularly advantageous for promoting adhesion between a polymeric fluorocarbon dielectric or insulating layer in integrated circuits and a substrate. The present invention is especially suitable for promoting the adhesion between plasma deposited polymeric fluorocarbon films onto such substrates as metals, semiconductors, silicon oxide and silicon nitride.

BACKGROUND ART

In advanced microelectronic chips, that structure referred to as back-end-of-line (BEOL) metallization requires several layers of metal interconnections that are separated by a dielectric. Presently, the dielectric typically employed is fabricated of sputtered quartz which has a dielectric constant of about 3.9. However, in order to reduce signal delays in future chips, it will become necessary to reduce the dielectric constant of the insulator so that the capacitance between metal levels will be reduced. Much effort is now involved in attempting to replace the quartz with various polyimides. Polyimides generally have a dielectric constant of at least about 2.8 and are deposited onto the chip by wet spin-on techniques followed by subsequent drying at elevated temperatures. However, wet-processing, spin-on and drying techniques are undesirable from a standpoint of reproduceability and from an environmental viewpoint in view of the volatile organic solvents required.

Halogenated polymeric materials such as poly(tetrafluoroethylene) (PTFE) are attractive candidates for advanced electronic packaging applications because of their very low dielectric constants, excellent chemical stability, low solvents/moisture absorption and excellent thermal stability. However, because of their relative chemical inertness and hydrophobic nature, these halogenated polymeric materials are difficult to process into electronic packaging structures. The lack of effective processing techniques has inhibited the exploitation of these materials by the electronics industry. The low surface energy of these materials gives the inability to adhere to other surfaces and must be effectively overcome to yield desirable metal adhesion for practical electronic packaging applications.

More recently, as described in copending U.S. patent application Ser. No. 07/693,736 and now U.S. Pat. No. 5,244,730, (DOCKET NO. YO989-053) filed concurrently herewith, disclosure of which is incorporated herein by reference, a plasma enhanced chemical vapor deposition technique has been provided for the fabrication of polymeric fluorocarbon films that can be used as interlevel insulator between metal line interconnects in integrated circuits. However, even with this new advanced technique, adhesion to various substrates is still not entirely satisfactory.

SUMMARY OF THE INVENTION

The present invention overcomes the adhesion problem of polymeric fluorocarbon films to other substrates, and makes it possible to provide a tenacious bond between the polymeric fluorocarbon and the underlying substrate.

In particular, the present invention is concerned with a method for adhering a polymeric fluorocarbon film to a substrate which includes providing a thin layer of silicon or a silicide intermediate between the substrate and the polymeric fluorocarbon film to thereby promote the adhesion between the substrate and the polymeric fluorocarbon film. The success of the present invention appears to be based on the formation of silicon-carbon bonds between the fluorocarbon film and the silicon containing adhesion promoter.

In addition, the present invention is concerned with a coated substrate that comprises the substrate, a thin layer of silicon or a silicide intermediate the substrate and a polymeric fluorocarbon film.

SUMMARY OF DRAWINGS

FIG. 1 is a schematic diagram of apparatus suitable for carrying out the process of the present invention.

PREFERRED AND VARIOUS MODES FOR CARRYING OUT INVENTION

The substrate onto which the polymeric fluorocarbon film is to be deposited is preferably one of those substrates encountered in fabricating integrated circuits which include silicon oxide, silicon nitride, and metals such as aluminum, copper, gold, and nickel. In addition, the technique of the present invention can be employed to enhance the adhesion between a polymeric fluorocarbon film and another polymeric fluorocarbon film.

In order to enhance the adhesion between the substrate and a subsequently applied polymeric fluorocarbon film, an interlayer of silicon and/or a silicide is provided. The interlayer is relatively thin and typically about 2 to about 20 nanometers, preferably about 3 to about 8 nanometers, and most preferably about 5 nanometers. It is believed that the success of the present invention is achieved because of the formation of silicon-carbon bonds between the polymeric fluorocarbon film and the silicon or silicide adhesion promoter.

The silicon-carbon bonds can be provided in a number of different ways. For example, a thin layer of silicon can be directly deposited on the substrate by well-known standard techniques such as evaporation, sputtering, chemical vapor deposition and plasma enhanced chemical vapor deposition.

When the substrate is a metal capable of forming a silicide, a thin layer of the metal silicide can be formed on the substrate to act as the adhesion promoter. Silicide-forming metals include titanium, tantalum, tungsten, niobium, molybdenum, hafnium, cobalt and vanadium with titanium and tantalum being preferred. The silicide layer can be formed by well-known techniques. A preferred method for forming the silicide layer involves heating to the desired temperature known for forming silicides such as about 300° to about 900° C. and reacting silicon with the deposited metal. Alternatively, codeposition such as in chemical vapor deposition or in sputtering can be employed.

In addition, when the substrate is a silicon-containing material such silicon oxide or silicon nitride, the silicon interlayer can be formed by ion bombardment of the substrate to expose dangling silicon bonds. In a preferred procedure, the silicon-containing compound substrate is subjected to an argon sputter process. The argon plasma process can be carried out in the same type of apparatus described in copending U.S. patent application Ser. No. 07/693,736 and now U.S. Pat. No. 5,224,730, (DOCKET NO. YO989-053), disclosure of which is incorporated herein by reference and illustrated in FIG. 1. If desired, a noble gas such as helium, neon or xenon can be used in place of the argon. The chamber walls and electrodes as disclosed in said copending U.S. patent application Ser. No. 07/693,736 and now U.S. Pat. No. 5,224,730, (DOCKET NO. YO989-053) are precoated with a fluorocarbon film 13. The walls and electrodes in the chamber are coated with a polymeric fluorocarbon film 13 typically about 1 to about 5 microns thick.

For instance, the fluorocarbon film 13 can be provided onto the walls of the chamber and electrodes by introducing into the chamber via conduit 5, a gaseous polymerizable fluorocarbon.

The chamber prior to introduction of the gas can be evacuated through vacuum coupling 6. The flow of the gas can controlled by valve 15 and measured by linear mass flow meter 16.

The gaseous polymerizable fluorocarbon introduced into the chamber includes $C_2F_4$, $C_4F_8$, $C_3$ $F_8$, and $C_2F_6$ and preferably is $C_2F_4$. The gaseous fluorocarbon is typically fed into the chamber at a rate of about 20 to about 150 standard cubic centimeters per minute (sccm) and preferably at about 100 sccm which corresponds to a residence time of about 0.9 seconds of the gaseous polymerizable fluorocarbon in a plasma chamber having a volume of about 48 liters. Prior to introduction of the gaseous fluorocarbon into the chamber, the chamber is evacuated, for instance, using a turbo molecular pump to provide a vacuum of at least about $10^{-6}$ torr.

The initial phase in coating the walls and electrodes is carried out in a manner so as to minimize ion bombardment of the first electrode 2 in order to assure against excessive incorporation of impurities into the fluorocarbon film 13. This can be accompanied by employing rf power supplied to the working electrode 2 of about 50 to about 100 watts. The power density is typically about 0.02 to about 0.05 W per $cm^2$ of the working electrode surface area. The pressure during this phase is typically about 100 mTorr to about 200 mTorr and more typically about 200 mTorr. The radio frequency is typically about 1 to about 100 megahertz and more typically 13.56-MHz. The rf power is capacitatively fed to the working electrode using a matching network 31 which includes a DC-blocking capacitor to minimize reflected power. The combination of pressure and power is selected to minimize the self-bias voltage on working electrode 2 to –50 volts or less.

This initial phase of coating the walls and electrode is normally carried out for about 5 to about 10 minutes. After this, the gas pressure is preferably reduced and the rf power is preferably increased, and the self-bias on the electrode 2 is typically increased. In particular, at this phase of coating the walls and electrodes, the amount of rf power that is supplied to the electrode 2 is in the range of about 100 watts to about 1000 watts, preferably about 200 to about 800 watts and most preferably about 200 watts to about 400 watts. The power density is typically about 0.05 to 0.4 W per $cm^2$ of the working electrode surface area and more typically about 0.15 W per $cm^2$ of the working electrode surface area. The pressure during the deposition is maintained in the range of about 10 to about 180 mTorr and preferably at about 20 to about 100 mTorr and most preferably about 26 mTorr. The radio frequency is typically about 1 to about 100 megahertz and more typically 13.56-MHz. The rf power is capacitatively fed to the working electrode using a matching network 31 which includes a DC-blocking capacitor to minimize reflected power. The self-bias voltage on the working electrode 2 should be about –50 volts to about –700 volts and typically about –500 volts to about –700 volts. This phase of the coating of the walls and electrodes is usually carried out for about 30 minutes to about 2 hours.

After the walls of the chamber and the electrodes are precoated with fluorocarbon film 13, the substrates 4 upon which the fluorocarbon films are to be deposited are placed on working electrode 2 in the chamber . The chamber 1 a second electrode 3 connected to ground. The working electrode 2 is capacitively connected to a radio frequency power source 14. Argon gas is introduced into the chamber at a flow rate of about 20 to about 150 standard cubic centimeters per minutes with a preferred flow rate of about 100 standard cubic centimeters per minute. The pressure during the argon sputter is about 10 to about 100 mTorr and preferably about 15 to about 50 mTorr and most preferably about 26 mTorr. The applied radio frequency power is about 100 to about 1000 watts, preferably about 200 to about 600 watts and most preferably about 300 to about 500 watts. The self-bias on the working electrode 2 is about –400 to about –700 volts. The time of the exposure is typically about 5 minutes to about 30 minutes and preferably about 10 minutes.

The argon gas can be supplied from gas source 18 via conduits 19 and 5. The flow rate can be controlled by valve 20 and monitored by linear mass flow meter 21.

In addition, if desired, an argon sputter treatment can be employed to preclean a silicon surface in order to assure that no oxide or other contamination remains on the silicon substrate prior to coating with the polymeric fluorocarbon film. In such case, the above parameters for the process can be employed except that the maximum time for the cleaning is typically about 5 minutes and preferably from about 1 to about 3 minutes.

The polymeric fluorocarbon film can be provided by any method but preferably is provided by the technique disclosed in U.S. patent application Ser. No. 07/693,736 and now U.S. Pat. No. 5,244,730, (DOCKET NO. YO989-053), referred to hereinabove. When an argon plasma treatment of the substrate is employed, it is most preferred that the polymeric fluorocarbon film be subsequently immediately deposited onto the treated substrate in the same apparatus employed for the argon treatment. In such event, it is preferred that the argon plasma treatment be stopped by providing a flow of the fluorocarbon polymerizable gas in admixture with the argon for about 1 minute to about 5 minutes after which the argon flow is stopped.

The flow rate of the polymerizable fluorocarbon gas is typically about 20 to about 150 standard cubic centimeters per minute and preferably about 100 standard cubic centimeters per minute which in the case of a reaction vessel of about 48 liters corresponds to a residence time of about 0.9 seconds of the gaseous fluorocarbon in the plasma chamber. Typical gaseous polymerizable fluorocarbons are $C_2F_4$, $C_4F_8$, $C_3F_8$ and $C_2$ $F_6$, and preferably $C_2F_4$.

To facilitate understanding of the preferred technique for providing the polymeric fluorocarbon film, reference is made to FIG. 1. For instance, the plasma deposition of the polymeric fluorocarbon film can be carried out in a chamber 1 capable of being evacuated, which chamber contains a first working electrode 2 and a second electrode 3.

The working electrode 2 and the second electrode 3 can be fabricated from aluminum or quartz. The electrodes are held in place with struts (not shown). The working electrode is preferably water-cooled through via 30. The first electrode 2 is capacitively connected to a radio frequency power source 14. Numeral 17 represents a ground shield, typically about 1 mil from the electrode to prevent sputtering of the electrode material during the deposition. The surface area of the working or first electrode 2 is typically less than and preferably about ½ to 1/10 and most preferably about ¼ of the combined surface area of the second electrode 3 and interior walls of chamber 1. In a vacuum chamber having the above described dimensions, the electrodes are spaced about 2 to about 10 inches apart and more typically about 8 inches apart. The second electrode is connected to ground. In a vacuum chamber having a volume of about 48 liters, the electrodes typically have diameters of about 6 to about 18 inches and more typically have diameters of about 12 to 16 inches. The substrate upon which the film is to be deposited is represented by numeral 4 and is located adjacent to and supported by the working electrode 2. The walls of the chamber and surfaces of the electrodes are coated with film of a fluorocarbon polymer 13 as discussed above. This is essential in assuring that the deposited fluorocarbon film is free from metallic contamination as well as assuring that the electrical properties of the discharge during the plasma coating are within the parameters necessary for achieving the desired film characteristics. The thickness of the fluorocarbon film 14 such as polytetrafluoroethylene on the walls of the chamber and the electrodes is typically about 1 to about 5 microns, preferably about 2 to about 5 microns, and most preferably about 2 to about 3 microns. In the event the film is too thin, contamination of the fluorocarbon film being deposited will not be prevented and the preferred electrical properties of the chamber during the deposition will not be maintained within the parameters required. On the other hand, if the layer is too thick, such will tend to lose its adhesion to the walls of the chamber thereby, causing particle contamination and pin holes in the polymeric fluorocarbon film being deposited.

The gaseous polymerizable fluorocarbon can be introduced into the chamber via the conduit 5. The chamber prior to introduction of the gas can be evacuated through vacuum coupling 6. The flow of the gas can controlled by valve 15 and measured by linear mass flow meter 16.

The gaseous fluorocarbon is typically fed into the chamber at a rate of about 20 to about 150 standard cubic centimeters per minute (sccm) and more typically at about 100 sccm which corresponds to a residence time of about 0.9 seconds of the gaseous polymerizable fluorocarbon in a plasma chamber having a volume of about 48 liters. Prior to introduction of the gaseous fluorocarbon into the chamber, the chamber is evacuated, for instance, using a turbo molecular pump to provide a vacuum of at least about $10^{-6}$ torr.

The amount of rf power that is supplied to the substrate electrode is in the range of about 100 watts to about 1000 watts, more usually about 200 to about 800 watts and most usually about 200 watts to about 400 watts. The power density is typically about 0.05 to 0.4 W per $cm^2$ of the working electrode surface area and more typically about 0.15 W per $cm^2$ of the working electrode surface area. The pressure during the deposition is maintained in the range of about 10 to about 180 mTorr and more typically at about 20 to about 100 mTorr and most typically about 26 mTorr. The radio frequency is typically about 1 to about 100 megahertz and more typically 13.56-MHz. The rf power is capacitatively fed to the working electrode using a matching network 31 including a DC-blocking capacitor in series with the working electrode to minimize reflected power. The self-bias voltage on the working electrode 2 is usually about −50 volts to about −700 volts and more usually about 500 volts to about −700 volts. The precoating of the walls of the chamber and the electrodes is instrumental in achieving the desired self-bias on the working electrode. This process by the judicious selection of the various process parameters results in achieving the unique properties of the fluorocarbon film by achieving energetic bombardment with ionized fluorocarbon fragments during the deposition. The energetic ion bombardment causes ion-enhanced etching of the film and gasifies the more volatile components of the growing film. Ion bombardment serves, therefore, to in situ remove, during growth, species which are inherently produced in the plasma and which would otherwise be incorporated in the growing film but which would adversely affect the properties of the deposited material. For instance, such would significantly reduce the thermal stability of the deposited film. The energy of the ions and the ion flux and accordingly the final properties of the fluorocarbon film depend on the pressure, power and self-bias voltage during the deposition. Films whereby high ion bombardment during deposition occur exhibit much better thermal stability than films deposited without or with very little ion bombardment.

Because of the difference between ion and election mobilities in the plasma and since the working electrode is effectively electrically isolated and connected to the power generator across a blocking capacitor, a DC bias potential appears on the electrode. As a result of the DC bias potential, the working plate electrode and substrate are subjected to positive ions from the plasma. The positive ion bombardment times to give rise to deposited films of relatively high density. Such high density films tend to resist taking up of oxygen from the air.

The films deposited, according to the above process, are normally deposited at a rate of about 30 nanometers/minute to about 50 nanometers/minute. The temperature of the substrate during the deposition is normally at about room temperature, but the energetic ion bombardment will cause some heating of the substrate during deposition.

Accordingly, the substrate temperature during deposition will be from about normal room temperature to about 100° C. Films deposited, pursuant to the above process, typically are about 0.01 to about 5 microns, more typically about 0.02 to about 5 microns and preferably about 0.1 to about 1 microns.

These films exhibit predominantly C-$CF_x$ bonding (greater than 33% of the film) and have a fluorine/carbon ratio of about 1:1 to about 3:1 and preferably about 1:1 to about 1.8:1. The films are thermally stable (essentially no loss in film thickness) when heated to at least 350° C. for at least 30 minutes in dry nitrogen. In addition, the dielectric constant of the film is a maximum of about 2.5, preferably about 1.9 to about 2.3 and most preferably about 1.9 to about 2.2. These films are highly crosslinked as contrasted to the linear films obtained by bulk polymerization.

The process as described herein provides for a tenacious bond between the substrate and polymeric fluorocarbon film.

Another method for forming a tenacious bond between various substrates and polymeric fluorocarbon films is disclosed in our U.S. Pat. No. 5,244,730.

The following non-limiting examples are presented to further illustrate the present invention.

EXAMPLE 1

A silicon nitride substrate of about 0.1 microns thick on a standard 5 inch diameter silicon wafer is supported on a 16 inch aluminum working electrode in a stainless steel vacuum chamber of the type described above. The volume of the vacuum chamber is about 48 liters. The walls of the vacuum chamber and the electrodes are coated with polytetrafluoroethylene film at a thickness of about 3 microns. The working electrode is water-cooled and capacitively connected to a 13.56-MHz radio frequency power source using a matching network to minimize reflected power. The chamber is evacuated using a turbo molecular pump to a vacuum of at least $10^{-6}$.

Argon gas is introduced into the chamber at a flow rate of about 100 sccm and a rf power is applied to the working electrodes at about 400 watts. The pressure in the chamber is about 26 mTorr. The argon gas treatment is continued for about 10 minutes which exposes dangling silicon bonds on the silicon nitride surface.

The argon treatment is stopped by flowing $C_2F_4$ gas along with the argon gas at a rate of 100 sccm for about 1 minute using the same conditions used for the argon. After this the argon flow is stopped. This overlap of the argon gas and fluorocarbon gas provide an extremely efficient and effective method of producing the desired silicon-carbon bonds necessary for the enhanced adhesion.

The $C_2F_4$ feed is continued at the above conditions for about 20 minutes to provide a polymerized fluorocarbon film of about 0.6 microns thick. The silicon layer formed is about 5 nanometers thick.

The tenacity of the adhesion bond of the fluorocarbon film to the substrate is qualitatively determined employing an adhesive tape test whereby an adhesive tape is attached to the fluorocarbon film on the substrate. The adhesive tape is then pulled in an attempt to remove the fluorocarbon film from the substrate. However, fluorocarbon films deposited pursuant to this example could not be peeled off or removed employing the typical adhesive tape test confirming the tenacious bond achieved by the present invention.

On the other hand, following the same procedure as employed in this example except for the argon treatment step resulted in fluorocarbon film that could be peeled off from the substrate by the above adhesive tape test demonstrating that the fluorocarbon film in such instance adhered better to the adhesive tape than to the underlying silicon nitride substrate.

What is claimed is:

1. A method for adhering a polymeric fluorocarbon film to a substrate which comprises providing a thin layer of silicon or a silicide having a thickness of up to about 50 nanometers on said substrate; placing said substrate and a working electrode in a chamber having walls, wherein said chamber can be evacuated and wherein the walls of said chamber and the electrode are coated with a polymeric fluorocarbon coating and wherein the electrode is capacitively coupled;

introducing in said chamber a gaseous polymerizable fluorocarbon; applying radio-frequency at a power level of about 100 watts to about 1000 watts to said electrode; to thereby deposit a polymeric fluorocarbon film on said layer of silicon or silicide while maintaining pressure in said chamber of about 10 to about 180 mTorr and a self-bias voltage on said electrode of about –50 to about –700 volts, and whereby said thin layer is intermediate said substrate and said polymeric fluorocarbon film and silicon-carbon bonds are formed between said thin layer and said fluorocarbon film for promoting the adhesion between said fluorocarbon film and said substrate.

2. The method of claim 1 wherein the substrate is a silicon-containing compound or a silicide-forming metal.

3. The method of claim 1 wherein said substrate is silicon oxide or silicon nitride.

4. The method of claim 1 wherein said substrate is a metal capable of forming a silicide and said thin layer is a silicide.

5. The method of claim 1 wherein the substrate is a silicon-containing compound and said thin layer is a thin layer of silicon that is provided by ion bombardment of the substrate.

6. The method of claim 5 wherein ion bombardment is from an argon plasma.

7. The method of claim 6 which comprises providing said argon plasma in said chamber.

8. The method of claim 7 wherein said argon has a flow rate of about 20 to about 150 sccm and said argon plasma is applied for about 5 to about 30 minutes.

9. The method of claim 8 wherein treatment with said argon plasma employs a treatment pressure of about 26 mTorr, said argon flow rate of about 100 sccm for a time of about 10 minutes, and said radio frequency is applied at a treatment power level of about 100 to about 400 watts.

10. The method of claim 9 wherein said polymeric fluorocarbon film has a dielectric constant to about 1.9 to about 2.3, a F/C ratio of about 1:1 to about 1.8:1, and has less than about 0.5% oxygen contamination.

11. The method of claim 7 which further includes subsequent to the argon plasma treatment, flowing a mixture of argon and gaseous polymerizable fluorocarbon for about 1 minute to about 5 minutes into the chamber, followed by introducing the gaseous fluorocarbon into the chamber and ceasing the argon gas flow.

12. The method of claim 11 wherein the gaseous polymerizable fluorocarbon is $C_2F_4$.

13. The method of claim 12 wherein the self-bias voltage is about –500 to about –700 volts.

14. The method of claim 1 wherein said fluorocarbon film has a thickness of about 0.01 to about 5 microns.

15. The method of claim 1 wherein the layer of silicon or silicide is about 2 to about 10 nanometers thick.

16. The method of claim 1 wherein said polymeric fluorocarbon film is about 0.02 to about 5 microns thick, has a maximum dielectric constant of about 2.5, is stable at temperatures of at least about 350° C., has a F/C ratio of about 1:1 to about 3:1.

17. The method of claim 1 wherein said polymeric fluorocarbon film is about 0.1 to about 1 micron thick.

18. The method of claim 1 wherein the radio frequency is about 1 to about 100 megahertz.

19. The method of claim 1 wherein said polymeric fluorocarbon film provides a dielectric layer in an integrated circuit.

* * * * *